(12) United States Patent
Wei et al.

(10) Patent No.: US 9,752,866 B2
(45) Date of Patent: Sep. 5, 2017

(54) MEASUREMENT SYSTEM

(71) Applicant: INDUSTRIAL TECHNOLOGY RESEARCH INSTITUTE, Hsinchu (TW)

(72) Inventors: Hsiang-Chun Wei, Taipei (TW); Yi-Sha Ku, Hsinchu (TW); Chia-Hung Cho, Hsinchu (TW); Chieh-Yu Wu, Hsinchu (TW); Chun-Wei Lo, Taichung (TW); Chih-Hsiang Liu, Hsinchu (TW)

(73) Assignee: INDUSTRIAL TECHNOLOGY RESEARCH INSTITUTE, Chu-Tung, Hsinchu (TW)

( * ) Notice: Subject to any disclaimer, the term of this patent is extended or adjusted under 35 U.S.C. 154(b) by 23 days.

(21) Appl. No.: 14/983,053

(22) Filed: Dec. 29, 2015

(65) Prior Publication Data

US 2017/0146339 A1 May 25, 2017

(30) Foreign Application Priority Data

Nov. 23, 2015 (TW) .............................. 104138851 A

(51) Int. Cl.
*G01B 11/22* (2006.01)
*G01B 11/02* (2006.01)
(Continued)

(52) U.S. Cl.
CPC .......... *G01B 11/22* (2013.01); *G01B 11/0616* (2013.01); *G01B 11/2441* (2013.01)

(58) Field of Classification Search
CPC ...... G01B 11/22; G01B 11/02; G01B 11/2441
See application file for complete search history.

(56) References Cited

U.S. PATENT DOCUMENTS 5,785,651 A * 7/1998 Kuhn ................... G01B 11/026
250/339.06
6,226,086 B1 5/2001 Holbrook et al.
(Continued)

FOREIGN PATENT DOCUMENTS

CN 100573036 C 12/2009
CN 102460672 5/2012
(Continued)

OTHER PUBLICATIONS

Office Action issued Oct. 25, 2016 in corresponding TW Application No. 104138851 with English language search report.

*Primary Examiner* — Tri Ton
*Assistant Examiner* — Jarreas C Underwood
(74) *Attorney, Agent, or Firm* — Muncy, Geissler, Olds & Lowe, P.C.

(57) ABSTRACT

A measurement system is configured to measure a surface structure of a sample. The surface of the sample has a thin film and a via, the depth of the via is larger than the thickness of the thin film. The measurement system includes a light source, a first light splitter, a first aperture stop, a lens assembly, a second aperture stop, a spectrum analyzer and an analysis module. The first light splitter disposed in the light emitting direction of the light source. The first aperture stop disposed between the light source and the first light splitter. The lens assembly is disposed between the first light splitter and the sample. The second aperture stop is disposed between the lens assembly and the first light splitter. The spectrum analyzer is disposed to at a side of the first light splitter opposite to the sample.

14 Claims, 10 Drawing Sheets

(51) Int. Cl.
*G01B 11/06* (2006.01)
*G01B 11/24* (2006.01)

(56) References Cited

U.S. PATENT DOCUMENTS

| | | | | |
|---|---|---|---|---|
| 6,898,537 B1 * | 5/2005 | McGahan | ............... | G01B 11/02 |
| | | | | 356/319 |
| 7,019,844 B2 | 3/2006 | Venugopal et al. | | |
| 7,443,512 B2 | 10/2008 | Kim et al. | | |
| 7,738,113 B1 | 6/2010 | Marx et al. | | |
| 7,782,468 B2 | 8/2010 | Courteville | | |
| 8,059,282 B2 | 11/2011 | Yang | | |
| 8,139,233 B2 * | 3/2012 | Ku | ............... | G01B 11/0625 |
| | | | | 356/241.1 |
| 8,531,679 B2 | 9/2013 | Scheiner | | |
| 8,699,021 B2 * | 4/2014 | Ku | ............... | G01B 11/22 |
| | | | | 356/303 |
| 8,873,067 B2 * | 10/2014 | Lee | ............... | H01L 22/12 |
| | | | | 356/450 |
| 8,885,173 B2 | 11/2014 | Ohtsuka et al. | | |
| 9,305,341 B2 * | 4/2016 | Claypool | ............... | G06T 7/0004 |
| 9,377,292 B2 * | 6/2016 | de Groot | | |
| 2003/0165755 A1 | 9/2003 | Mui et al. | | |
| 2009/0015842 A1 | 1/2009 | Leitgeb et al. | | |
| 2009/0066953 A1 | 3/2009 | Horie | | |
| 2013/0033698 A1 * | 2/2013 | Fujimori | ............ | G01B 11/0625 |
| | | | | 356/51 |
| 2013/0148877 A1 | 6/2013 | Claypool | | |
| 2015/0227790 A1 * | 8/2015 | Smits | ............... | G06K 9/00604 |
| | | | | 348/78 |

FOREIGN PATENT DOCUMENTS

| | | |
|---|---|---|
| CN | 102082108 | 8/2012 |
| TW | 244391 | 4/1995 |
| TW | I408363 B1 | 9/2013 |
| TW | I441271 | 6/2014 |
| WO | WO 2005/044099 A1 | 5/2005 |
| WO | WO-2010/151290 A1 | 12/2010 |

\* cited by examiner

MEASUREMENT SYSTEM

RELATED APPLICATIONS

This application claims priority to Taiwan Application Serial Number 104138851, filed Nov. 23, 2015, which is incorporated by reference herein in its entirety.

BACKGROUND

Technical Field

The disclosure relates to a measurement system.

Description of Related Art

As the development of 3D IC (3 dimension integrated circuit), the problem of RC delay generated in semiconductor technique is solved. One kind of miniature packaging techniques of the 3D IC is TSV (Through-Silicon Via) packaging technique. Electric signals can be transmitted in shorter path in the vertical direction in the TSV packaging technique, thus the total length of the conducting wires decreases, and the corresponding RC delay reduces significantly.

SUMMARY

According to the disclosure, to measurement system is configured to measure a surface structure of a sample. A surface of the sample has a via. The measurement system includes a light source, a first light splitter, a first aperture stop, an lens assembly, a second aperture stop, a spectrum analyzer and an analysis module. The first aperture stop is disposed between the light source and the first light splitter. The lens assembly is disposed between the first light splitter and sample. The second aperture stop is disposed between the lens assembly and the first light splitter. The spectrum analyzer is disposed at a side of the first light splitter opposite to the sample. The analysis module is electrically connected to the spectrum analyzer. The light source is configured to generate incident light, a cross section of the incident light covers an opening of the via. The first light splitter is disposed in the light emitting direction of the light source, and is configured to reflect the incident light to form first reflected light. A size of the first aperture stop is adjustable and configured to adjust a size of the cross section of the incident light, the first aperture stop and the first light splitter are a first default distance apart. The lens assembly is configured to guide the first reflected light to the sample to form second reflected light. The lens assembly has a focal length reference point, the focal length reference point and the sample are a default object distance apart, and the focal length reference point and the first light splitter are a second default distance apart. A size of the second aperture stop is adjustable and configured to filter the second reflected light. The second aperture stop and a back focal plane of the lens assembly are a third default distance apart. The spectrum analyzer and the first light splitter are a fourth default distance apart. The filtered second reflected light passing through the first light splitter is received by the spectrum analyzer. The spectrum analyzer forms an optical spectrum according to the received second reflected light. The analysis module is configured to separate the optical spectrum into a high frequency spectrum and a low frequency spectrum, and determine a depth of the via according to the high frequency spectrum. Wherein the first default distance is substantially equal to the fourth default distance, a sum of the second default distance and the fourth default distance is substantially equal to an image distance of the lens assembly.

BRIEF DESCRIPTION OF THE DRAWINGS

The disclosure can be more understood by reading the following detailed description of the embodiments, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
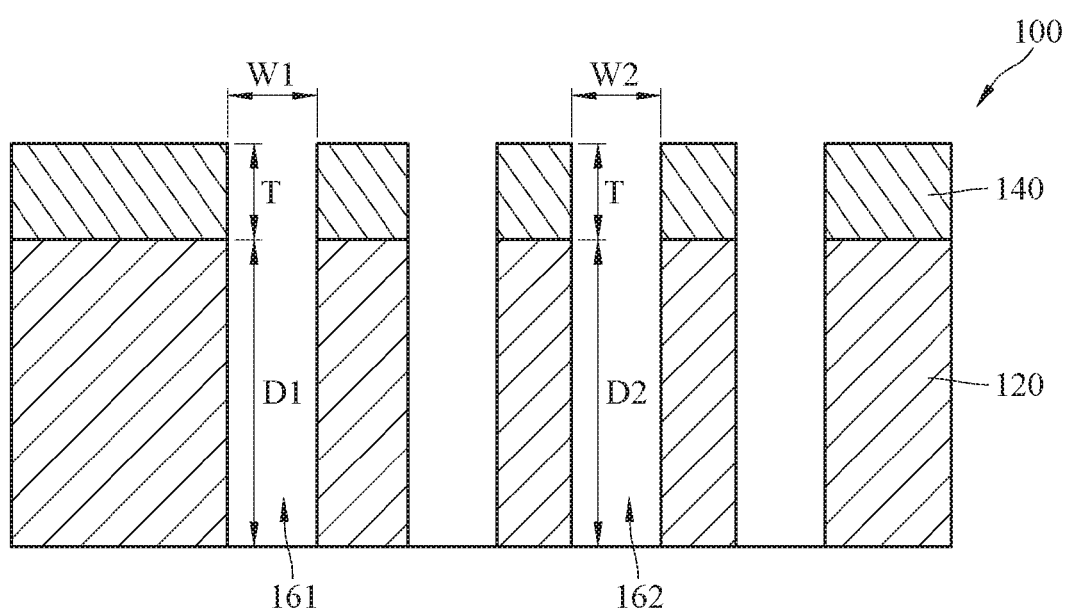
FIG. 1 is a schematic diagram of a surface structure of a sample according to a first embodiment.
Figure 2:
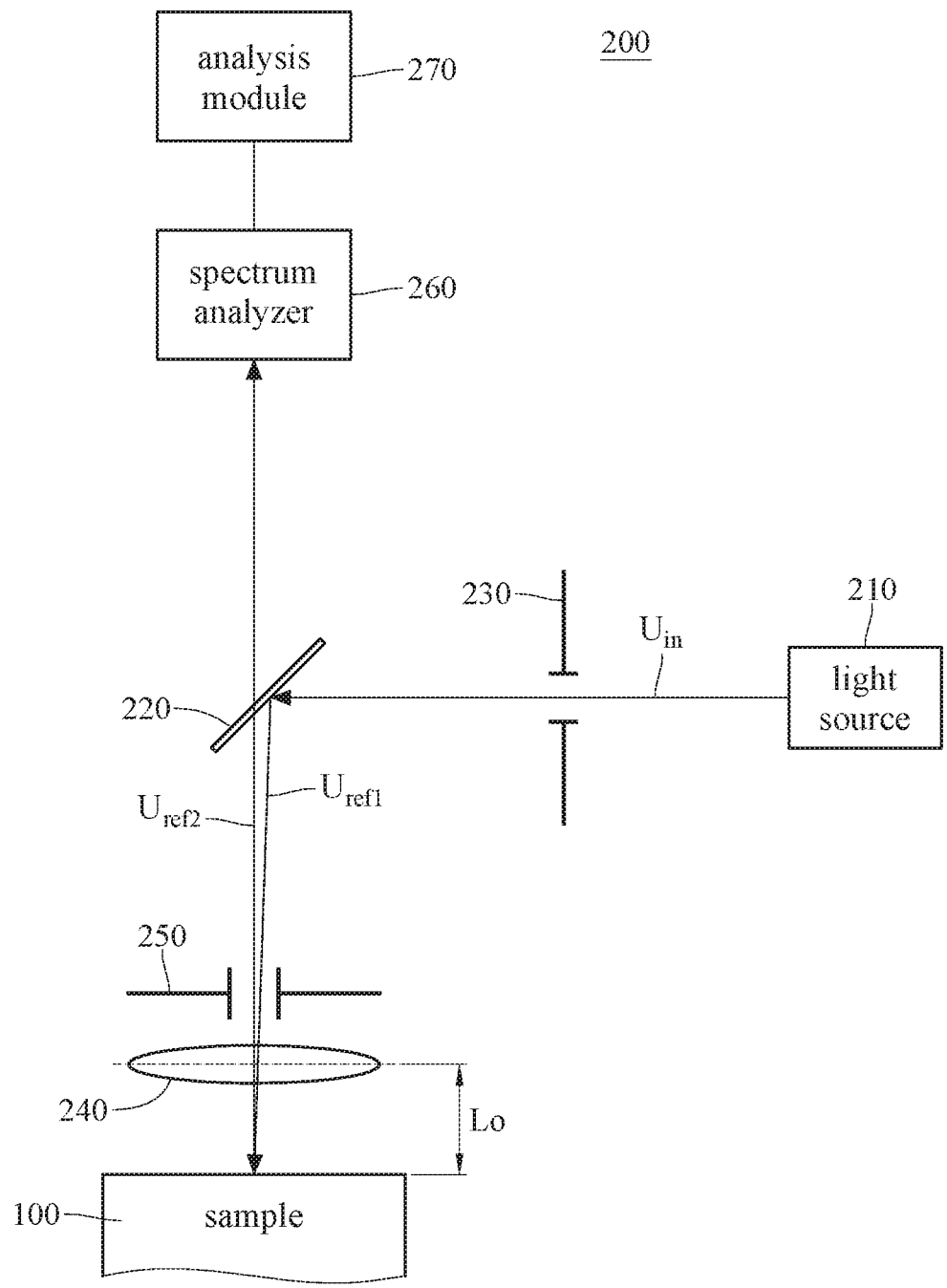
FIG. 2 is a schematic diagram of a measurement system and the sample according to the first embodiment.

Please refer to FIG. 1 and FIG. 2, FIG. 1 is a schematic diagram of a surface structure of a sample according to a first embodiment, FIG. 2 is a schematic diagram of a measurement system and the sample according to the first embodiment. Wherein the sample is a device under test. In this embodiment, the measurement system 200 may be used for measuring a surface structure of a sample 100. The sample 100 provided in this embodiment may include a substrate 120, a thin film 140 and two vias 161, 162. The thin film 140 may be disposed on a surface of the substrate 120, and the vias 161, 162 may be located on the substrate 120. The widths of the vias 161, 162 are W1 and W2, respectively. The depths of the vias 161, 162 are D1 and D2, respectively. The depths D1, D2 may be larger than a thickness T of the thin film 140, but the disclosure is not limited thereto. The substrate 120, for example, may be a silicon substrate of a 3D IC (3 dimension integrated circuit), but the disclosure is not limited thereto. The vias 161 and 162, for example, may be TSVs (Through-Silicon Vias) in the silicon substrate, but the disclosure is not limited thereto. In this embodiment, the width W1 may be equal to the width W2, and the depth D1 may be equal to the depth D2. The arrangement of the aforementioned size relationships among the widths W1, W2 and the depths D1, D2 are not limited thereto.

As shown in FIG. 2, the measurement system 200 may include a light source 210, a first light splitter 220, a first aperture stop 230, a lens assembly 240, a second aperture stop 250 and a spectrum analyzer 260. In this embodiment and the other embodiments, the measurement system 200 may be used for measuring the thickness T of the thin film 140 and the depth D1 of the via 161 simultaneously. The number of the vias measured by the measurement system 200 at one time is not limited thereto.

The light source 210 may be used for emitting an incident light Uin. The incident light Uin, for example, may be a light beam emitted from a broadband light source and transmit in a first direction, but the disclosure is not limited thereto. In this embodiment, the light source 210 may be a halogens lamp, but the disclosure is not limited thereto.

The first light splitter 220 may be disposed at a side of the light source 210, and the incident light Uin emitted from the light source 210 may be transmit towards the first light splitter 220. The first light splitter 220 may be used for reflecting the incident light Uin to generate a first reflected light Uref1 and guiding the first reflected light Uref1 to the sample 100 in a second direction. An included angle between the first direction and the second direction is not limited thereto.

Figure 3:
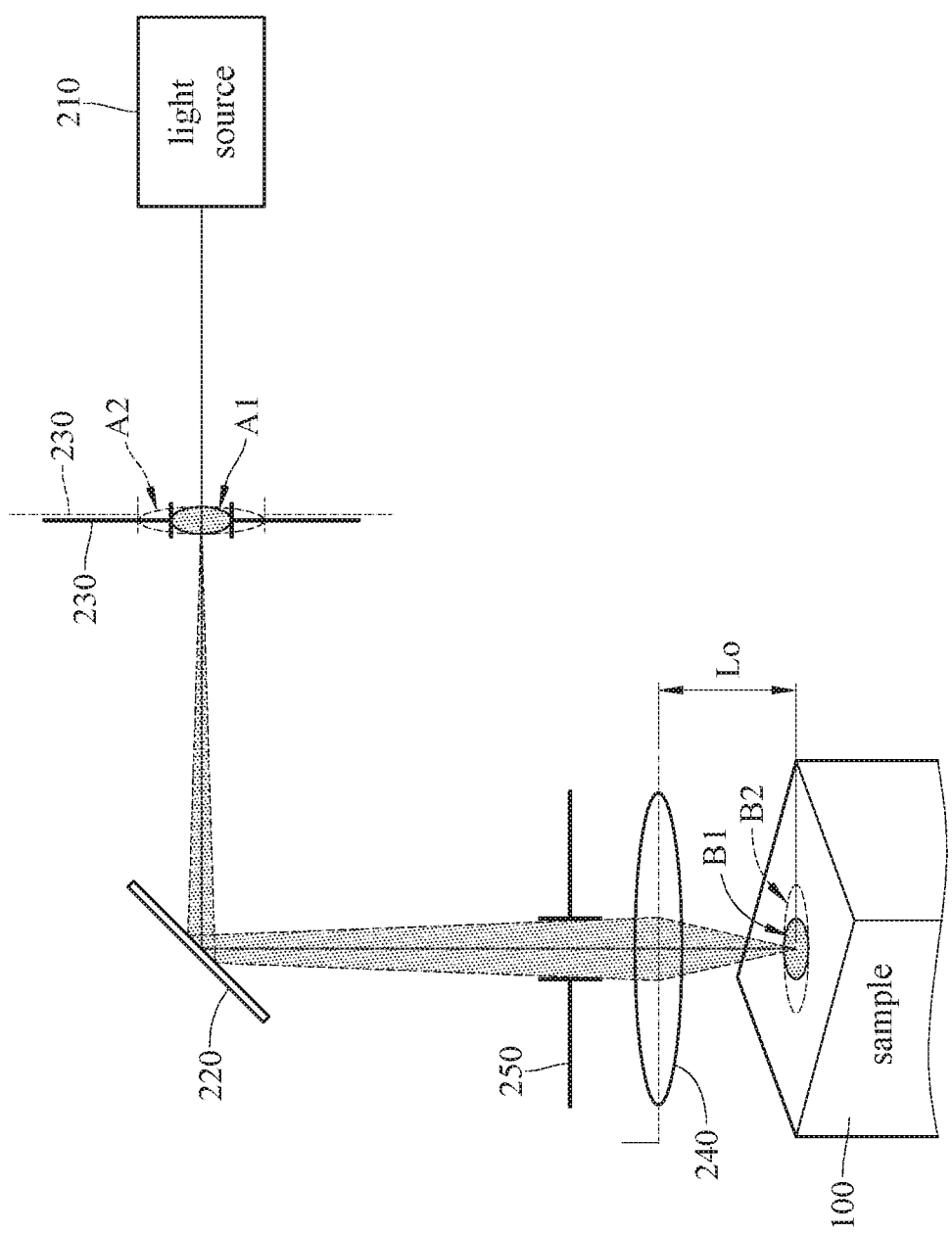
FIG. 3 is a schematic diagram of the measurement system in FIG. 2 with a diameter of an aperture stop being adjusted.

Please refer to FIG. 3. FIG. 3 is a schematic diagram of the measurement system in FIG. 2 with a diameter of an aperture stop being adjusted. The first aperture stop 230 may be disposed between the light source 210 and the first light splitter 220. A size of the first aperture stop 230 may be adjustable so that a cross section of the incident light Uin may be adjustable by adjusting the size of the first aperture stop 230. The cross section of the incident light Uin may cover at least one of the openings of the vias 161, 162. There may be a first default distance between the first aperture stop 230 and the first light splitter 220. The details about the first default distance will be described in FIG. 9 and the following related paragraphs.

The first aperture stop 230 may be adjustable in the range from the smaller size A1 to the larger size A2. When a size of the opening of the via 161 on the sample 100 is large, the first aperture stop 230 may be adjusted to the larger size A2. When the size of the opening of the via 161 on the sample 100 is small, the first aperture stop 230 may be adjusted to smaller size A1. The cross section of the incident light Uin may cover the openings of the via 161, 162. Specifically, when the incident light Uin transmits to the surface of the sample 100, the incident light Uin may cover the openings of the via 161, 162. In this embodiment, the cross section of the incident light Uin covers the opening of the via 161, but the disclosure is not limited thereto. However, it is obvious to a person having ordinary skill in the art that the cross section of the incident light Uin can be adjusted by the aperture stop so as to cover plural vias.

As shown in FIG. 2 and FIG. 3, the lens assembly 240 may be disposed between the first light splitter 220 and the sample 100. The lens assembly 240, for example, may include at least one lens element with same focal length or different focal lengths, and surfaces of the lens element may be concave or convex. The lens assembly 240 may be used for focusing the first reflected light Uref1 on the sample 100 to generate the second reflected light Uref2. In detail, the first reflected light Uref1 may be reflected by the sample 100 so as to generate the second reflected light Uref2. The second reflected light Uref2 may transmit along a third direction substantially opposite to the second direction. An included angle between the second direction and the third direction is not limited thereto.

In this embodiment, when the first aperture stop 230 is equal to the size A1, a projection of the first reflected light Uref1 on the sample 100 may have an area B1. When the first aperture stop 230 is equal to the size A2, a projection of the first reflected light Uref1 on the sample 100 may have an area B2. In other words, the projection of the first reflected light Uref1 on the sample 100 is corresponded to the size of the first aperture stop 230. Thus, the first aperture stop 230 is adjusted so as to adjust the area of the projection of the first reflected light Uref1 on the sample 100. As a result, the cross section of the first reflected light Uref1 on the sample 100 covers the opening of the via 161 or alternatively covers a plurality of openings of the vias 161 and 162.

In this embodiment, the lens assembly 240 is used for focusing the first reflected light Uref1 on the sample 100, but the disclosure is not limited thereto. In other embodiments, the lens assembly 240 may be used for diverging the light transmitting through. The lens assembly 240 may have a reference point for determining the equivalent focal lengths of the lens assembly 240. The reference point may be located at a center of the lens assembly 240. There may be a default object distance Lo between the reference point and the surface of the sample 100, and there may be a second default distance between the reference point of the lens assembly 240 and the first light splitter 220.

Figure 4:
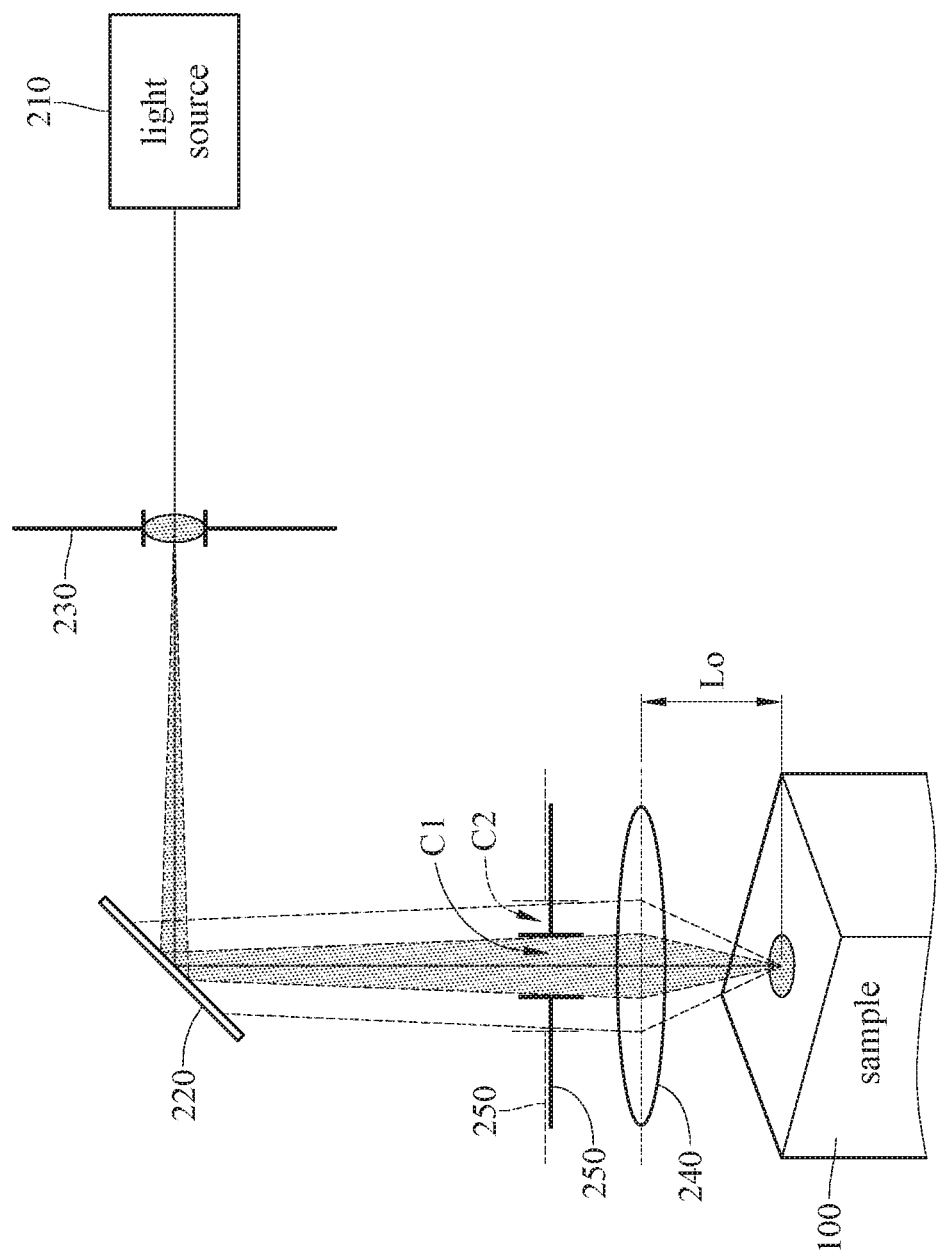
FIG. 4 is a schematic diagram of the measurement system in FIG. 2 with a diameter of another aperture stop being adjusted.

Please refer to FIG. 4. FIG. 4 is a schematic diagram of the measurement system in FIG. 2 with a diameter of another aperture stop being adjusted. The second aperture stop 250 may be disposed between the lens assembly 240 and the first light splitter 220. There may be a third default distance between the second aperture stop 250 and a back focal plane of the lens assembly 240. The size of the second aperture stop 250 is adjustable for blocking a part of the second reflected light Uref2. In detail, the second reflected light Uref2 may include a plurality of light rays in the reflecting path. Some light rays of the second reflected light Uref2 in the reflecting path may be regarded as noise signals in the spectrum analysis for the reflected light. The arrangement of the second aperture stop 250 is favorable for blocking unwanted light rays of the second reflected light Uref2 by adjusting the size of the second aperture stop 250. The adjustment of the size of the second aperture stop 250 may be equal to the adjustment of the NA (numerical aperture) of the measurement system 200 as well as equal to the adjustment of the SNR (signal-to-noise ratio) of the measurement system 200. In this embodiment, the size of the second aperture stop 250 may be adjustable in the range from the smaller size C1 to the larger size C2. When the second aperture stop 250 is adjusted to the smaller size C1, fewer amounts of the light rays of the second reflected light Uref2 is allowed to pass through the second aperture stop 250. When the second aperture stop 250 is adjusted to the larger size C2, more amounts of the light rays of the second reflected light Uref2 is allowed to pass through the second aperture stop 250. The aforementioned restrictions are merely exemplary for illustration, and the disclosure is not limited thereto.

In this embodiment, there is a through hole on the aperture stop. The size of the aperture stop may represent the diameter of the through hole or an entrance pupil diameter of the aperture stop.

The spectrum analyzer 260 may be disposed at a side of the first light splitter 220 opposite to the sample 100. There may be a fourth default distance between the spectrum analyzer 260 and the first light splitter 220. The spectrum analyzer 260 may be used for receiving the second reflected light Uref2 passing through the second aperture stop 250 and the first light splitter 220, and the spectrum analyzer 260 is capable of generating an optical spectrum according to the received second reflected light Uref2.

The analysis module 270 may be electrically connected to the spectrum analyzer 260 for separating the optical spectrum into a high frequency spectrum and a low frequency spectrum and determining the depth D1 of the via 161 according to the high frequency spectrum. In this embodiment, the analysis module 270 may determine the thickness T of the thin film 140 according to the low frequency spectrum. For example, the analysis module 270 may convert the high frequency spectrum or the low frequency spectrum from wavelength domain into reciprocal wavelength domain, and then performs a discrete Fourier transform on the converted high frequency spectrum or the converted low frequency spectrum so as to determine the depth D1 of the via 161 or the thickness T of the thin film 140. The analysis module 270 may be electrically coupled to the spectrum analyzer 260 in wire or wireless manners, and the analysis module 270 may be a PC or a server, but the disclosure is not limited thereto.

The illustration mentioned above is an introduction of the elements of the measurement system 200. The method for measuring the sample 100 by the measurement system 200 is illustrated hereafter.

Please refer to FIG. 1 to FIG. 4, the light source 210 emits the incident light Uin, and the size of the first aperture stop 230 is adjusted for adjusting the cross section of the incident light Uin. The incident light Uin transmits to the first light splitter 220 in the first direction and is reflected by the first light splitter 220 so as to generate the first reflected light Uref1. The first reflected light Uref1 transmits and passes through the second aperture stop 250 in the second direction. After the first reflected light Uref1 passes through the second aperture stop 250, the first reflected light Uref1 is focused on the sample 100 by the lens assembly 240. The first reflected light Uref1 is reflected by the sample 100 so as to generate the second reflected light Uref2.

Figure 5A:
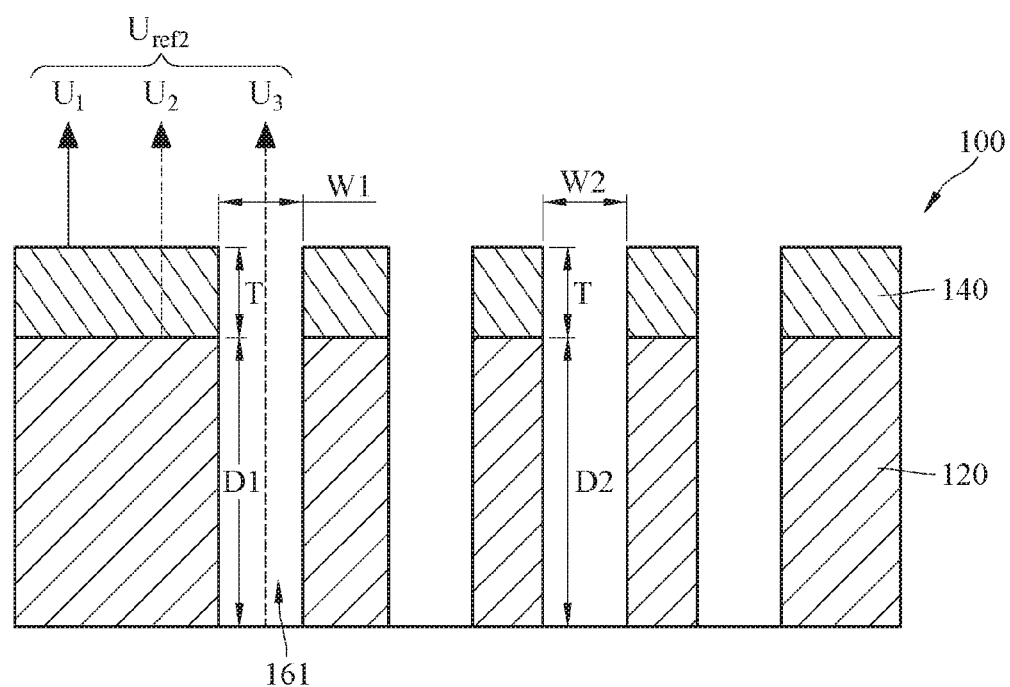
FIG. 5A is a schematic diagram of light reflected by the sample in FIG. 1.

The second reflected light Uref2 includes a plurality of light rays in this embodiment. Please refer to FIG. 5A, FIG. 5B and FIG. 5C, which show the combination of the second reflected light and how it effects a measurement result. FIG. 5A is a schematic diagram of light reflected by the sample in FIG. 1, FIG. 5B is a schematic diagram of a reflecting path of the light reflected by the sample in FIG. 1, FIG. 5C is a schematic diagram of another reflecting path of the light reflected by the sample in FIG. 1.

As shown in FIG. 5A, the second reflected light Uref2 includes a plurality of light rays U1, U2, U3. The light ray U1 is reflected from a interface between the air and the thin film 140, the reflected light U2 is reflected from a interface between the thin film 140 and the substrate 120, and the reflected light U3 is reflected from a bottom of the via 161. Since the light rays U1, U2, U3 are reflected from different interfaces or plans, the path lengths of the light rays U1, U2, U3 are different from each other, and thereby the frequencies or the intensities of the light rays U1, U2, U3 are different from each other. Furthermore, the light rays U1, U2, U3 may also have different frequencies and intensities from the light rays reflected from the other position on the sample 100.

Figure 5B:
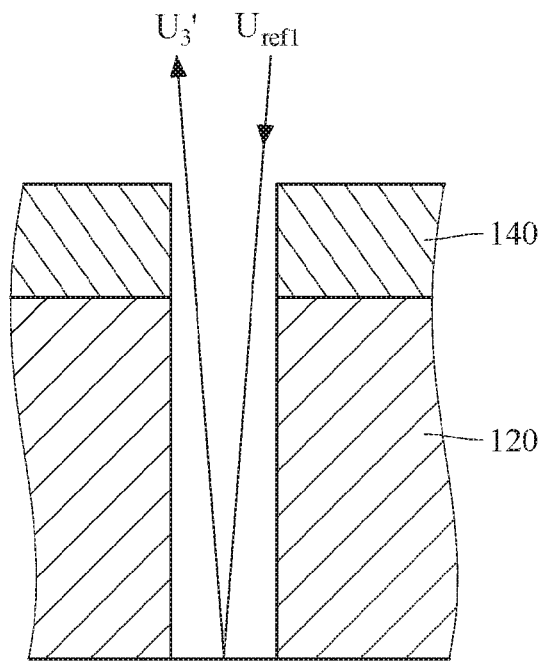
FIG. 5B is a schematic diagram of a reflecting path of the light reflected by the sample in FIG. 1.
Figure 5C:
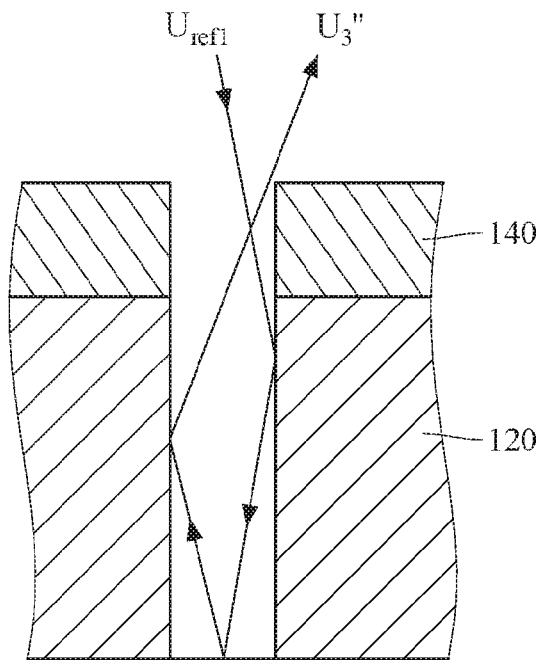
FIG. 5C is a schematic diagram of another reflecting path of the light reflected by the sample in FIG. 1.

As shown in FIG. 5B and FIG. 5C, the light ray U3 may include a light ray U3' and a light ray U3". The light ray U3' is the reflected light generated by the first reflected light Uref1 when the first reflected light Uref1 is incident directly on the bottom of the via 161, and the light ray U3' transmits out of the opening of the via 161 without being reflected by a side wall of the via 161. The light ray U3" is the reflected light generated by the first reflected light Uref1 when the first reflected light Uref1 is incident on the side wall of the via 161 and reflected at least one time by the side wall or the bottom of the via 161. The reflected light which is not reflected by the bottom of the via 161 and directly transmitting out of the via 161 but reflected at least one time by the side wall of the via 161 is defined as the light ray U3".

Since the light ray U3" reflected by the side wall of the via 161 has longer path length and not stationary, the light ray U3" is regarded as a noise signal in the in the spectrum analysis for the reflected light. Furthermore, since the light ray U3" is deviated from a normal line of a plane on the opening of the via 161, at least a part of the light ray U3" is blocked by adjusting the size of the second aperture stop 250 for the second reflected light Uref2 including the light ray U3' as much as possible, thereby improving the signal-to-noise ratio of the measurement system 200.

The second reflected light Uref2 passing through the first light splitter 220 may be received by the spectrum analyzer 260. The spectrum analyzer 260 may generate the optical spectrum and corresponding data according to the second reflected light Uref2. The analysis module 270 may separate the optical spectrum into the high frequency spectrum and the low frequency spectrum and perform a discrete Fourier transform to transform the high frequency spectrum and the low frequency spectrum. The analysis module 270 may determine the depth D1 of the via 161 and the thickness T of the thin film 140 according to the information from the transformed high frequency spectrum and low frequency spectrum.

Figure 6:
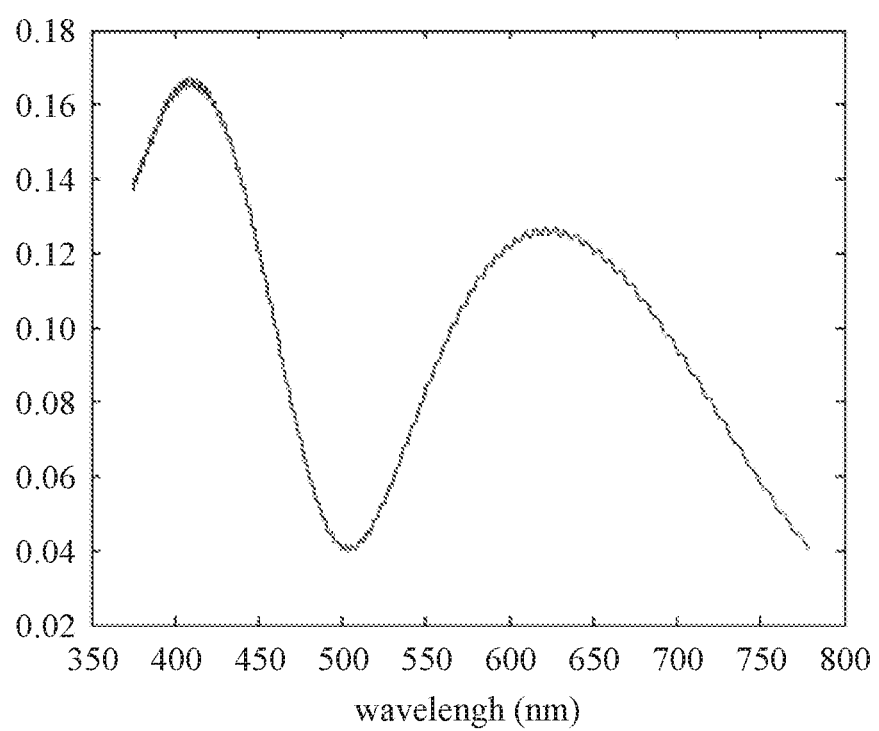
FIG. 6 is an optical spectrum of the light reflected by the sample in FIG. 1.

Please refer to FIG. 6. FIG. 6 is an optical spectrum of the light reflected by the sample in FIG. 1. In FIG. 6, the horizontal axis represents wavelength of the second reflected light Uref2 with the unit being nm (nanometer). The vertical axis represents the normalized intensity of the second reflected light Uref2 with the intensity of to the incident light Uin as a baseline value. The optical spectrum in FIG. 6 may include a low frequency spectrum and a high frequency spectrum.

Figure 7A:
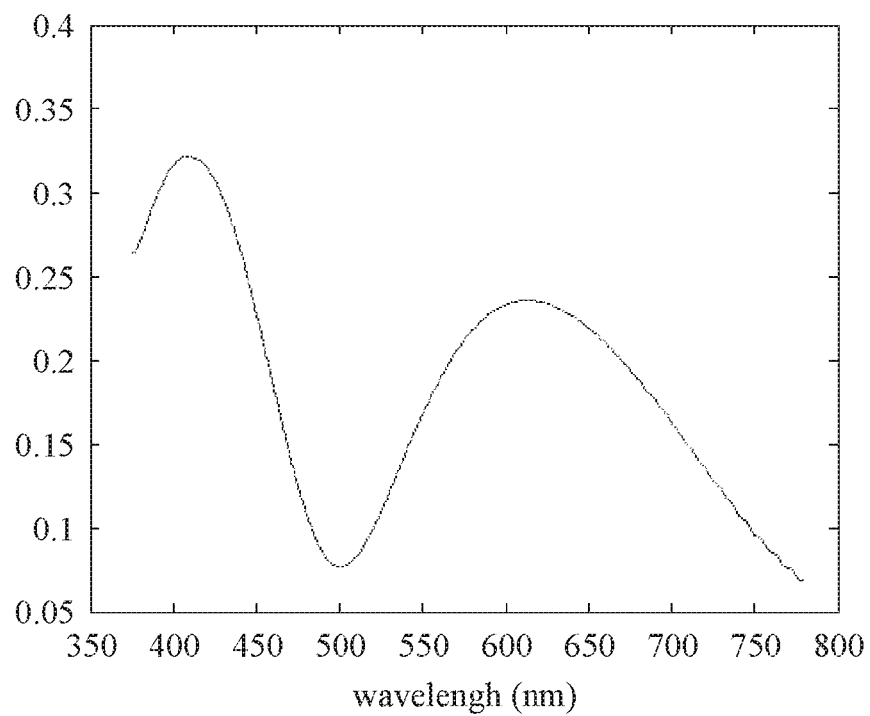
FIG. 7A is a low frequency spectrum generated by analyzing the optical spectrum in FIG. 6.
Figure 7B:
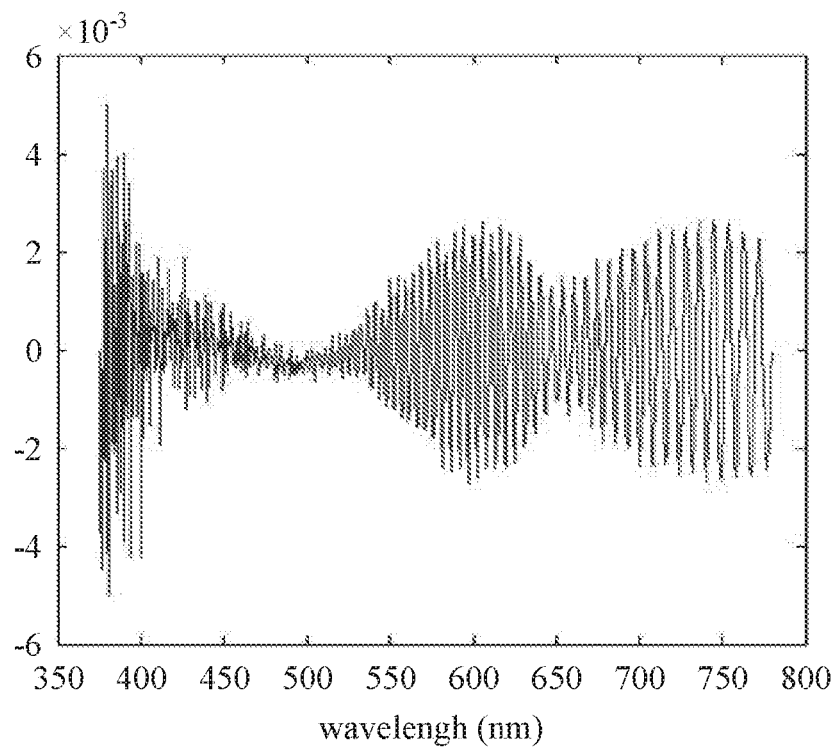
FIG. 7B is a high frequency spectrum generated by analyzing the optical spectrum in FIG. 6.

Please refer to FIG. 7A and FIG. 7B. FIG. 7A is a low frequency spectrum generated by analyzing the optical spectrum in FIG. 6. FIG. 7B is a high frequency spectrum generated by analyzing the optical spectrum in FIG. 6. The analysis module 270 separates the optical spectrum shown in FIG. 6 into the low frequency spectrum shown in FIG. 7A and the high frequency spectrum shown in FIG. 7B. Wherein, either in FIG. 7A or in FIG. 7B, the representations of the horizontal axis and the vertical axis are the same as those in FIG. 6.

Figure 8A:
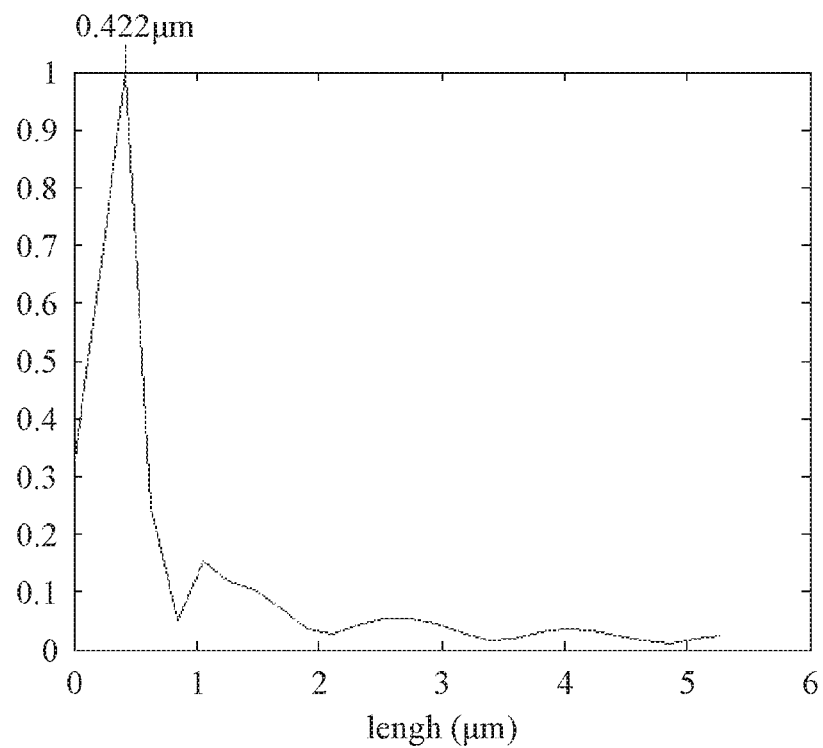
FIG. 8A is a waveform generated by performing a signal process on the low frequency spectrum in FIG. 7A.
Figure 8B:
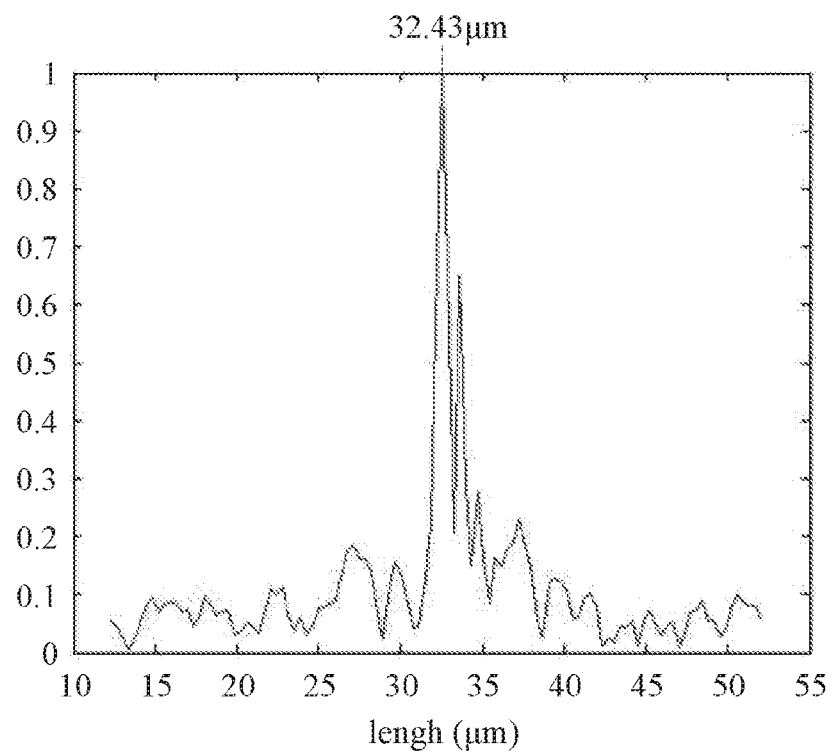
FIG. 8B shows a waveform generated by performing a signal process on the high frequency spectrum in FIG. 7B.

Please refer to FIG. 8A and FIG. 8B. FIG. 8A is a waveform generated by performing a signal process on the low frequency spectrum in FIG. 7A. FIG. 8B shows a waveform generated by performing a signal process on the high frequency spectrum in FIG. 7B. Since the high frequency spectrum and the low frequency spectrum in FIG. 7A and FIG. 7B are in the wavelength domain, the analysis module 270 transforms the high frequency spectrum and the low frequency spectrum into reciprocal wavelength domain first, and then performs a discrete Fourier transform on the transformed high frequency spectrum and low frequency spectrum to generate the waveforms in FIG. 8A and FIG. 8B. In FIG. 8A and FIG. 8B, the horizontal axis represents length with the unit being μm (micrometer), the vertical axis represents normalized intensity of the second reflected light Uref2 with the intensity of to the incident light Uin as a baseline value. The relationships between the high frequency spectrum, the low frequency spectrum, the thickness T and the depth D1 can be known by one having ordinary skill in the art according to the theory of optical interference.

In FIG. 8A, the waveform has a maximum peak at 0.422 μm in the horizontal axis, and the waveform in FIG. 8A corresponds to the thickness T of the thin film 140, and thereby the analysis module 270 determines that the thickness T of the thin film 140 is equal to 0.422 μm. In FIG. 8B, the waveform has a maximum peak at 32.43 μm in the horizontal axis, and the waveform in FIG. 8B corresponds to the depth D1 of the via 161, and thereby the analysis module 270 determines that the depth D1 of the via 161 is equal to 32.43 μm.

Figure 9:
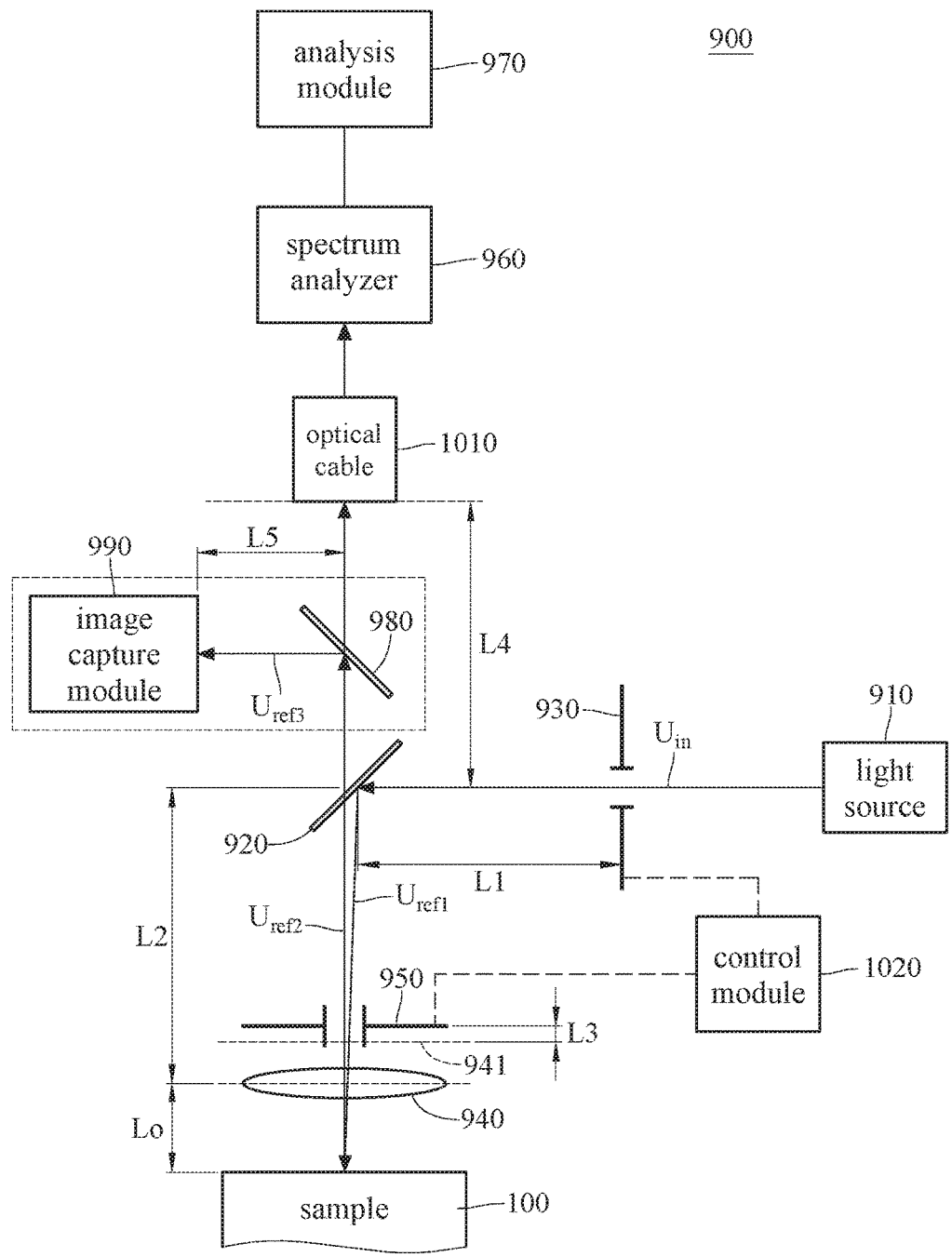
FIG. 9 is a schematic diagram of a measurement system and the sample according to a second embodiment.

Please refer to FIG. 9. FIG. 9 is a schematic diagram of a measurement system and the sample according to a second embodiment. In this embodiment, the measurement system 900 is disclosed. Since the second embodiment is similar to the first embodiment, only the differences will be illustrated hereafter.

In this embodiment, the measurement system 900 may further include a second light splitter 980, an image capture module 990, an optical fiber 1010, and a control module 1020. The optical fiber 1010 may be coupled to the spectrum analyzer 960, and the second light splitter 980 may be disposed between the optical fiber 1010 and the first light splitter 920. The second light splitter 980 may be used for reflecting at least a part of the second reflected light Uref2 to generate the third reflected light Uref3. The third reflected light Uref3 may transmit in the third direction, and the included angle between the second direction and the third direction is not limited thereto. For example, the image capture module 990 may be a camera having CCD (Charge-coupled Device), but the disclosure is not limited thereto.

The control module 1020 may be coupled to the first aperture stop 930 and the second aperture stop 950, respectively and configured to adjust the size of the first aperture stop 930 and the size of the second aperture stop 950. The control module 1020 may adjust the size of the first aperture stop 930 according to a size of the opening of the via, so the cross section of the incident light Uin is larger than the opening of the via and covers the opening of the via. And the control module 1020 may adjust the size of the second aperture stop 950 according to a signal-to-noise ratio of the measurement system 900. When the signal-to-noise ratio of the measurement system 900 is larger than a default threshold value, the control module 1020 may reduce the size of the second aperture stop 950, so the signal-to-noise ratio of the measurement system 900 may decrease to smaller than the default threshold value. The optical fiber 1010 may be used for coupling the second reflected light Uref2 passing through the second light splitter 980 and guiding the second reflected light Uref2 to the spectrum analyzer 960 for the aforementioned spectrum analysis. The image capture module 990 may be used for receiving the third reflected light Uref3 and generating an image of the sample 100 according to the third reflected light Uref3. For example, the user moves the sample 100 according to the image until the first reflected light Uref1 covers the opening of the via 161. In this embodiment, the measurement system 900 may further include a locating module (not shown in the figure). The locating module may be electrically connected to the analysis module 970, and the locating module may move the sample 100 to a proper position according to the analysis data of the analysis module 970 so that the opening of the via 161 is covered by the first reflected light Uref1. In other embodiments, the locating module may be electrically connected to the image capture module 990, and the locating module may move the sample 100 to the proper position according to the data acquired by the image capture module 990.

As shown in FIG. 9, there may be a first default distance L1 between the first aperture stop 930 and the first light splitter 920. There may be a second default distance L2 between the first light splitter 920 and the lens assembly 940. There may be a default object distance Lo between the lens assembly 940 and the surface of the sample 100. There may be a third default distance L3 between the second aperture stop 950 and a back focal plane 941 of the lens assembly 940. There fore may be a fourth default distance L4 between the first light splitter 920 and the spectrum analyzer 960. There may be a fifth default distance L5 between the second light splitter 980 and the image capture module 990.

The first default distance L1 may be substantially equal to the fourth default distance L4, and the first default distance L1 may be substantially equal to a sum of the fifth default distance L5 and a distance between the first light splitter 920 and the second light splitter 980. Moreover, a sum of the second default distance L2 and the fourth default distance L4 may be substantially equal to an image distance of the lens assembly 940. In this embodiment, an absolute value of the third default distance L3 may be shorter than 5 μm. According to the aforementioned embodiments, one having ordinary skill in the art can realize that a distance between the spectrum analyzer 260 and the first light splitter 220 may be substantially equal to a distance between the first light splitter 220 and the first aperture stop 230 in FIG. 2.

According to the disclosure, the measurement system is provided for measuring the film thickness and the depth of the via on the substrate. The size of the first aperture stop is adjustable for adjusting the cross section of the incident light so that the incident light is capable of covering sufficient amount of openings of the vias. Furthermore, The size of the second aperture stop is adjustable for blocking sufficient amount of reflected light from the sample, thereby adjusting the numerical aperture of the measurement system for improving the signal-to-noise ratio. Besides, the light reflected from the sample and passing through the second aperture stop is received by the spectrum analyzer for generating the optical spectrum, and the analysis module separates the optical spectrum into the high frequency spectrum and the low frequency spectrum, and the depths of the via and the film thicknesses are determined according to the high frequency spectrum and the low frequency spectrum, respectively. Thus, the measurement system has the capability with high dynamic range to measure the vias having large diameter, small diameter, high density and high aspect ratio so that it is favorable for the measurement system being applicable to different kinds of manufacturing processes.

The foregoing description, for the purpose of explanation, has been described with reference to specific embodiments; however. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. A measurement system for measuring a surface structure of a sample, a surface of the sample having a via, and the measurement system comprising:
   a light source, for generating incident light, a cross section of the incident light covering an opening of the via;
   a first light splitter, disposed in a light emitting direction of the light source and configured to reflect the incident light to form first reflected light;
   a first aperture stop, disposed between the light source and the first light splitter, a size of the first aperture stop being adjustable and configured to adjust a size of the cross section of the incident light, the first aperture stop and the first light splitter being a first default distance apart;
   an lens assembly, disposed between the first light splitter and the sample and configured to guide the first reflected light to the sample to form second reflected light, the lens assembly having a focal length reference point, the focal length reference point and the sample being a default object distance apart, the focal length reference point and the first light splitter being a second default distance apart;
   a second aperture stop, disposed between the lens assembly and the first light splitter, a size of the second aperture stop being adjustable to filter the second reflected light, the second aperture stop and a back focal plane of the lens assembly being a third default distance apart;
   a spectrum analyzer, disposed at a side of the first light splitter opposite to the sample, the spectrum analyzer and the first light splitter being a fourth default distance apart, the filtered second reflected light passing through the first light splitter and being received by the spectrum analyzer, the spectrum analyzer forming an optical spectrum according to the received second reflected light; and
   a computer, electrically connected to the spectrum analyzer and configured to separate the optical spectrum into a high frequency spectrum and a low frequency spectrum, and determine a depth of the via according to the high frequency spectrum;
   wherein the first default distance is substantially equal to the fourth default distance, a sum of the second default distance and the fourth default distance is substantially equal to an image distance of the lens assembly.

2. The measurement system of claim 1, further comprising:
   a locator, configured to move the sample, so as to make the first reflected light cover the via in the sample.

3. The measurement system of claim 1, further comprising:
   a second light splitter and a camera, the second light splitter being disposed between the first light splitter and the spectrum analyzer, the second light splitter being configured to guide a part of the second reflected light, which passes through the first light splitter, to the spectrum analyzer, and reflect another part of the second reflected light to form third reflected light, the camera being configured to form an image corresponding to a structure of the sample according to the third reflected light.

4. The measurement system of claim 3, wherein the second light splitter and the camera are a fifth default distance apart, the second light splitter and the first light splitter are a sixth default distance apart, a sum of the fifth default distance and the sixth default distance is substantially equal to the first default distance and the fourth default distance.

5. The measurement system of claim 1, wherein the computer further determines a thickness of a thin film according to the low frequency spectrum when the surface of the sample has the thin film.

6. The measurement system of claim 5, wherein the computer applies a discrete Fourier transform to the high frequency spectrum and the low frequency spectrum to determine the depth of the via or the thickness of the thin film.

7. The measurement system of claim 1, further comprising a controller, coupled to the first aperture stop and the second aperture stop, respectively and configured to adjust the size of the first aperture stop and the size of the second aperture stop.

8. The measurement system of claim 7, wherein the controller adjusts the size of the first aperture stop according to a size of the opening of the via, so the cross section of the incident light is larger than the opening of the via and covers the opening of the via.

9. The measurement system of claim 7, wherein the controller adjusts the size of the second aperture stop according to a signal-to-noise ratio of the measurement system; and when the signal-to-noise ratio of the measurement system is larger than a default threshold value, the controller reduces the size of the second aperture stop, so the signal-to-noise ratio of the measurement system decreases to smaller than the default threshold value.

10. The measurement system of claim 1, further comprising an optical fiber, coupled to the spectrum analyzer and disposed between the spectrum analyzer and the first light splitter, and the optical fiber being configured to couple the second reflected light and receive the second reflected light.

11. The measurement system of claim 1, wherein the lens assembly is configured to focus the first reflected light.

12. The measurement system of claim 1, wherein the first default distance is equal to the fourth default distance.

13. The measurement system of claim 1, wherein an absolute value of the third default distance is shorter than 5 μm.

14. The measurement system of claim 1, wherein the computer applies a discrete Fourier transform to the high frequency spectrum and the low frequency spectrum to determine the depth of the via or a thickness of a thin film.

* * * * *